(12) United States Patent
Bernitz et al.

(10) Patent No.: US 8,434,941 B2
(45) Date of Patent: May 7, 2013

(54) TEMPERATURE MEASURING SENSOR AND METHOD OF PRODUCING SAME

(75) Inventors: Georg Bernitz, Nuremberg (DE); Heinrich Zitzmann, Lauf an der Pegnitz (DE)

(73) Assignees: Georg Bernitz, Nuremberg (DE); Heinrich Zitzmann, Lauf an der Pegnitz (DE)

( * ) Notice: Subject to any disclaimer, the term of this patent is extended or adjusted under 35 U.S.C. 154(b) by 438 days.

(21) Appl. No.: 12/374,640

(22) PCT Filed: Jun. 29, 2007

(86) PCT No.: PCT/EP2007/005807
§ 371 (c)(1),
(2), (4) Date: Feb. 23, 2011

(87) PCT Pub. No.: WO2008/009347
PCT Pub. Date: Jan. 24, 2008

(65) Prior Publication Data
US 2011/0134961 A1 Jun. 9, 2011

(30) Foreign Application Priority Data
Jul. 21, 2006 (DE) .......... 10 2006 033 856

(51) Int. Cl.
*H01C 3/04* (2006.01)
*H01C 7/10* (2006.01)
(52) U.S. Cl.
USPC ............. 374/185; 374/178; 338/25; 338/22 R
(58) Field of Classification Search .................. 374/185, 374/178; 338/25, 22 R
See application file for complete search history.

(56) References Cited

U.S. PATENT DOCUMENTS

| | | | |
|---|---|---|---|
| 4,050,052 A | 9/1977 | Reichelt et al. | |
| 4,901,051 A | 2/1990 | Murata et al. | |
| 5,294,910 A * | 3/1994 | Tani et al. | ............ 338/306 |
| 5,406,246 A | 4/1995 | Friese et al. | |
| 7,607,829 B2 * | 10/2009 | Sumida et al. | ............ 374/184 |
| 7,746,212 B2 * | 6/2010 | Zitzmann et al. | ......... 338/22 R |
| 7,746,213 B2 * | 6/2010 | Zitzmann et al. | ............ 338/25 |
| 2006/0225269 A1 | 10/2006 | Zitzmann et al. | |
| 2007/0195066 A1 | 8/2007 | Bernitz et al. | |

FOREIGN PATENT DOCUMENTS
JP        A 11160163    6/1999

* cited by examiner

*Primary Examiner* — Christopher Fulton
(74) *Attorney, Agent, or Firm* — Glenn Patent Group; Michael A. Glenn

(57) ABSTRACT

A method of producing a temperature measuring sensor including an insulating substrate having a top surface and a bottom surface, the top surface including a first area and a second area, and a first contact and a second contact being formed in the first area, the above contacts having a structured measuring film located therebetween: creating a conductive connection between the first contact on the top surface of the insulating substrate and the bottom surface of the insulating substrate, and a first conductive layer as a first terminal area of the temperature measuring sensor on the bottom surface such that the first conductive layer is electrically connected to the conductive connection, as well as a second conductive layer on the second area of the top surface as a second terminal area of the temperature measuring sensor such that the second conductive layer is in contact with the second contact.

13 Claims, 2 Drawing Sheets

TEMPERATURE MEASURING SENSOR AND METHOD OF PRODUCING SAME

CROSS REFERENCE TO RELATED APPLICATIONS

This application is a U.S. National Phase of PCT/EP2007/005807 filed 29 Jun. 2007, which claims priority to German Patent Application No. 10 2006 033 856.1 filed 21 Jul. 2006.

BACKGROUND OF THE INVENTION

The present invention relates to a temperature measuring sensor and to a method of producing same, and specifically to a temperature measuring sensor comprising terminal areas allowing good contacting with lead wires.

In conventional approaches, there has been a tendency to reduce the size of, or to miniaturize, structural elements and electric circuits more and more, so that, for example, a plurality of structural elements are produced at a high density on a single wafer or substrate, said plurality of structural elements subsequently being diced for further use.

The advantage of these miniaturizations is that on the one hand, the space taken up by the structural elements may be reduced in other components, and, which is also essential, that a plurality of such structural elements may be produced within a single substrate, so that the resources useful for production are used in an increasingly optimum manner. A plurality of structural elements may now be obtained from one substrate, so that an increased yield may be obtained by utilizing the same amount of material, so that the overall cost of each structural element is reduced with regard to the substrate material used, in accordance with the space taken up by the structural element.

One problem encountered with these progressive miniaturizations is that as the temperature measuring sensor becomes smaller, the contact faces available for connecting the temperature measuring sensor become smaller accordingly. For example, with temperature measuring sensors miniaturized in this manner, the available contact face does not provide sufficient mechanical strength for connecting with lead wires or other pads, so that a reduced level of connecting reliability results, particularly when using lead wires.

A conventional structural element is described in more detail with reference to FIG. 2, which structural element is a sensor chip or temperature measuring sensor, for example, wherein the contact areas are located on a common surface. This structural element comprises an insulating substrate 100, for example a ceramic substrate. A top surface 102 of the ceramic substrate 100 has a metal layer 104, e.g. a platinum film, formed thereon. The sensor chip comprises a first contact area 106 as well as a second contact area 108, which have a structured platinum film 110 arranged therebetween, for example in a meandering shape. Contact reinforcements 112 and 114 of a conductive material are located on the contact faces 106 and 108, respectively. In the example, shown in FIG. 2, of a conventional temperature measuring sensor, the measuring film 110 is protected by a glaze coating 116 located between the contact reinforcements 112 and 114. As may be seen, the contact faces 112, 114 are quite small compared to the overall dimension of the element, and as the level of miniaturization of the overall element increases, here, too, the available contact face for connecting to lead wires or the like decreases, so that the above-mentioned problems associated with the quality of the terminal connection result.

One example for solving these problems is discussed in DE 103 58 282 A1, and shall be discussed below with reference to FIG. 3, the elements known from FIG. 2 being provided with the same reference numerals here. An insulating layer 118 is located on the glaze 116 and on the reinforcement 112 of the first contact 106, said insulating layer 118 essentially covering the entire exposed top surface of the sensor element shown in FIG. 1, except for some of the reinforcement 114 of the second contact face 108. The surface thus formed has a conductive layer 120 deposited thereon, which covers the insulating layer 118 as well as the exposed area of the contact reinforcement 114 of the second contact 108. In addition, the substrate 100 has a via 122 formed therein, for example by means of a hole filled with a conductive material. The via 122 extends from the first contact 106 on the first surface 102 to a second surface 124 of the substrate 100. This second surface 124 has a further electrically conductive layer 126 formed thereon, which essentially completely covers the bottom surface 124 of the substrate 100 and is in contact, via the via 122, with the first contact 106 of the sensor device.

Even though the solution shown in FIG. 3 does well at solving the above-mentioned problems concerning attachment of the lead wires (e.g. when the lead wires are soldered) in that relatively large faces are provided, it has turned out that in particular when welding the lead wires, a very high thermal load occurs which in the present arrangement may cause problems, e.g. cracks in the underlying glaze coating, despite the "relatively large faces".

One has found that during attachment of the lead wires to the top contact face 120, for example by means of resistance welding, an impairment of the underlying glaze coating 118 may occur which is caused by the "thermal shock-wave". The welding impulse generates a sudden heat wave which propagates downward across the contact face (metal) and proceeds, within fractions of a second, as far as the underlying insulating layer (glaze) as a short heat pulse. Due to this sudden heat pulse, which is not isotropic even within a plane, but is stronger in the central area and less intense toward the outside, the glaze coating is heated up suddenly and unevenly, as a result of which thermal tensions build up which may lead to cracks in the glaze coating.

In unfavorable cases, the platinum meandering web underlying the glaze coating may also be damaged by this, which could result in an interruption of the resistor trace and, thus, in the sensor failing.

SUMMARY

According to an embodiment, a method of producing a temperature measuring sensor may have the steps of: providing the temperature measuring sensor, which includes an insulating substrate having a top surface and a bottom surface, the top surface including a first area and a second area, and a first contact and a second contact being formed in the first area, said contacts having a structured measuring film formed therebetween on the top surface; creating a conductive connection between the first contact on the top surface of the insulating substrate and the bottom surface of the insulating substrate; creating a first conductive layer as a first terminal area of the temperature measuring sensor on the bottom surface such that the first conductive layer is electrically connected to the conductive connection; and creating a second conductive layer on the second area of the top surface as a second terminal area of the temperature measuring sensor such that the second conductive layer is in contact with the second contact.

According to another embodiment, a temperature measuring sensor may have: an insulating substrate having a top surface and a bottom surface, the top surface including a first area and a second area, and a first contact and a second contact being formed in the first area, said contacts having a structured measuring film formed therebetween on the top surface; a conductive connection between the first contact on the top surface of the insulating substrate and the bottom surface of the insulating substrate; a first conductive layer as a first terminal area of the temperature measuring sensor on the bottom surface, said conductive layer being implemented such that the first conductive layer is electrically connected to the conductive connection; and a second conductive layer on the second area of the top surface as a second terminal area of the temperature measuring sensor, said conductive layer being implemented such that the second conductive layer is in contact with the second contact.

The present invention provides a method of producing a temperature measuring sensor, comprising: providing the temperature measuring sensor, which comprises an insulating substrate having a top surface and a bottom surface, the top surface comprising a first area and a second area, and a first contact and a second contact being formed in the first area, said contacts having a structured measuring film located therebetween; creating a conductive connection between the first contact on the top surface of the insulating substrate and the bottom surface of the ceramic substrate; creating a first conductive layer as a first terminal area of the temperature measuring sensor on the bottom surface such that the first conductive layer is in contact with the conductive connection; and creating a second conductive layer on the second area of the top surface as a second terminal area of the temperature measuring sensor such that the second conductive layer is in contact with the second contact.

The present invention further provides a temperature measuring sensor comprising: an insulating substrate having a top surface and a bottom surface, the top surface comprising a first area and a second area, and a first contact and a second contact being formed in the first area, said contacts having a structured measuring film located therebetween; a conductive connection between the first contact on the top surface of the insulating substrate and the bottom surface of the ceramic substrate; a first conductive layer as a terminal area of the temperature measuring sensor on the bottom surface, said conductive layer being arranged such that the first conductive layer is in contact with the conductive connection; and a second conductive layer on the second area of the top surface as a second terminal area of the temperature measuring sensor, said conductive layer being ing arranged such that the second conductive layer is in contact with the second contact.

One advantage of the present invention is that the above-described problems concerning the impairment of a glaze coating and/or a resistive layer are clearly reduced, according to the invention, by the process of attaching the wires, when the contact area is expanded as depicted in FIG. 1A or 1B, or is changed such that no resistor traces underlie the metallized welding area.

Alternatively, the conductive connection may be formed by a conductive layer extending from the first contact area to the second surface across a lateral face of the structural element.

A further advantage of the invention is that improved mechanical strength may be achieved as compared to conventional approaches, it being possible to produce inventive temperature measuring sensors at lower cost as compared to the alternative solution described, e.g., in FIG. 3.

In accordance with a further embodiment of the present invention, feed lines, e.g. in the form of lead wires, are connected to the two terminal areas, and a further sheathing of the structural element with the lead wires attached thereto may optionally be provided, the lead wires being welded on, in the event of a high-temperature application, and the sheathing being a glaze. For applications in a lower-temperature range, the lead wires may also be soldered on, and the sheathing may be formed by a resin.

BRIEF DESCRIPTION OF THE DRAWINGS

Embodiments of the present invention will be detailed subsequently referring to the appended drawings, in which.

DETAILED DESCRIPTION OF THE INVENTION

Figure 1A:
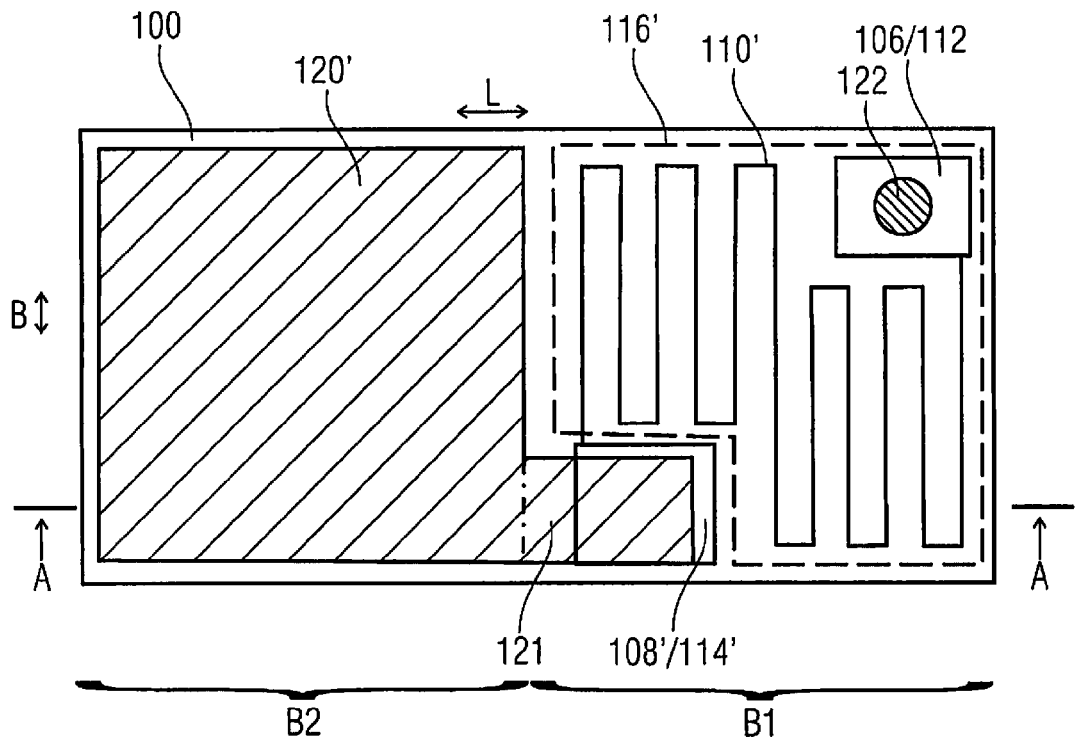
FIG. 1A shows a top view of an embodiment of an inventive temperature measuring sensor.

Within the context of the following description of the embodiments of the present invention, it shall be noted that in the various drawings, elements which are identical or have identical actions have been given identical reference numerals.

On the basis of a known sensor chip in OCD film technology (OCD=opposed contact device) as is used, for example, for temperature sensors, heating elements and the like, and as was described in more detail with reference to FIG. 3, the modifications which will be discussed in more detail later on are performed in accordance with the present invention. For reasons of economic efficiency, the starting point used here is a substrate or wafer comprising a multitude of individual sensors. In addition to the examples of a platinum temperature measuring sensor element, which will be used in the description which follows, it is also possible to use other sensors based on metal films, such as nickel, molybdenum, tungsten, or other temperature measuring sensors comprising similar configurations with regard to arrangement contacts 106 and 108 on a shared surface 102. It shall further be noted at this point that the present invention is not limited to such temperature measuring sensors wherein the electric circuit is formed in the form of a specifically structured metal film. Rather, the electric circuit 110 may also be formed by temperature measuring sensors which are formed within the substrate 100 and wherein only the contacts 106 and 108 are led out to the surface 102.

Figure 1B:
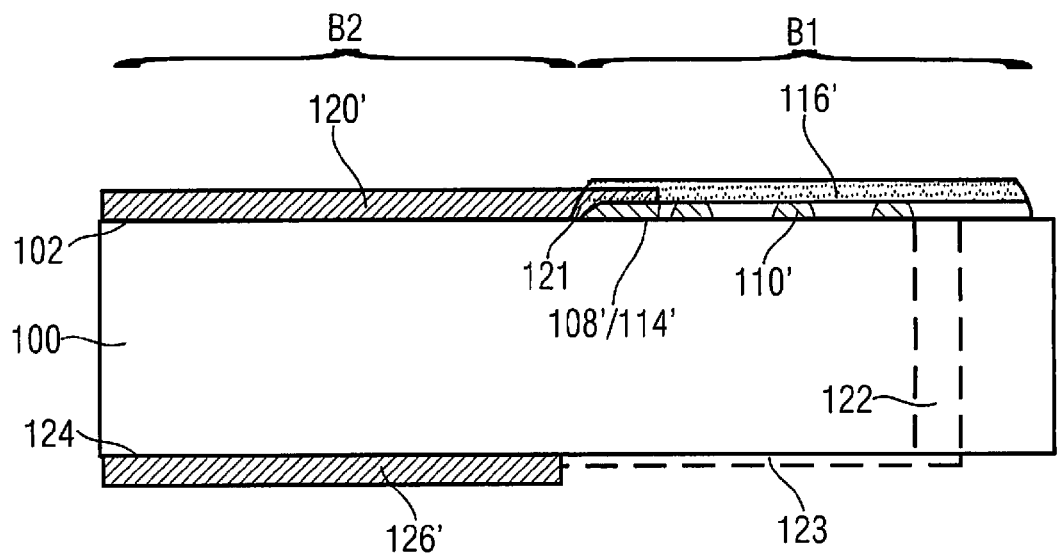
FIG. 1B shows a cross-section of an embodiment of an inventive temperature measuring sensor along section A-A of FIG. 1A.
Figure 2:
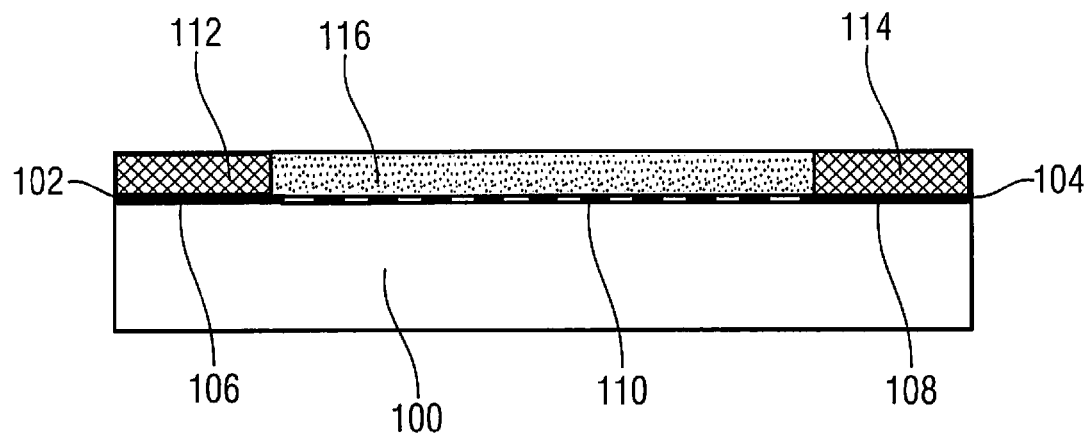
FIG. 2 shows a conventional temperature measuring sensor in accordance with a conventional approach.
Figure 3:
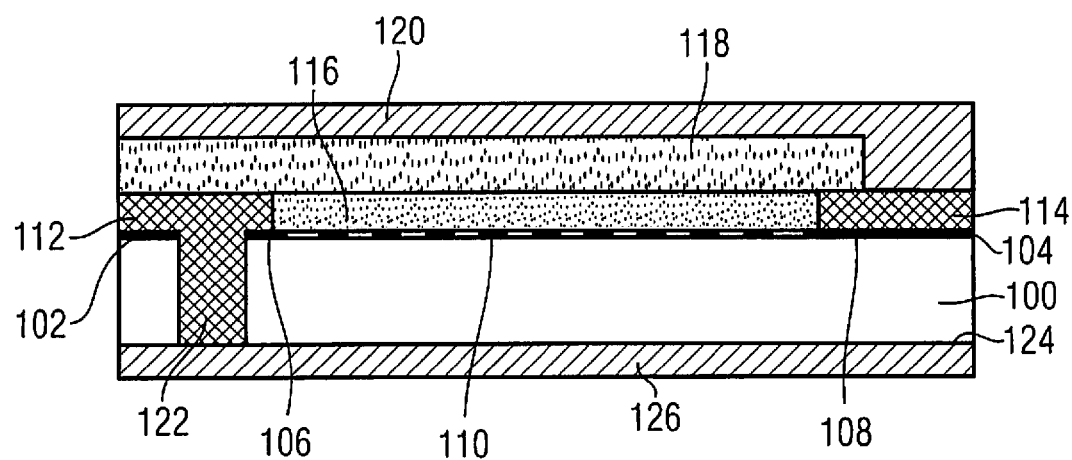
FIG. 3 shows a development of the conventional temperature measuring sensor in accordance with a conventional approach.

FIG. 1 shows an embodiment of the inventive temperature measuring sensor, the elements known from FIGS. 2 and 3 being provided with the same reference numerals.

FIG. 1A shows a top view of the embodiment, and FIG. 1B shows a section along the cutting edge A-A in accordance with FIG. 1A. FIGS. 1A and 1B show a temperature measuring sensor comprising an insulating substrate 100, a top surface 102 and a bottom surface 124, the top surface 102 comprising a first area B1 and a second area B2. The first area B1 has a first contact 106, 112 composed of a first contact area 106 and a contact reinforcement 112, a second contact 108', 114' composed of a second contact area 108' and a second contact reinforcement 114', and has a structured measuring film 110' located thereon which is located between the first contact 106, 112 and the second contact 108', 114' and is electrically connected thereto. Therefore, the first area B1 may also be referred to as an active area. FIGS. 1A and 1B further depict a conductive connection 122 between the first contact 106, 112 in the first area B1 of the top face of the insulating substrate 100 and the bottom surface 124 of the insulating substrate 100, the conductive connection 122 here being implemented as a via 122. A first conductive layer 126' is implemented, as the first terminal area of the temperature measuring sensor, on the bottom surface 124 such that the first conductive layer 126' is in contact with the conductive connection 122 via a further conductive connection 123.

The second area B2 of the top surface 102 of the insulating substrate 100, which area comprises the remainder, relative to the first area B1, of the surface of the top surface 102, has a second conductive layer 120' located thereon as the second terminal area of the temperature measuring sensor, the second conductive layer 120' extending, at the position of the second contact 108', 114', into the first area B1, or being connected to the second contact 108', 114' via a conductive connection 121, so as to guarantee a sound electric connection between the second conductive layer 120' and the second contact 108', 114'. The second area B2 may therefore also be referred to as a terminal area. The glaze coating 116' covers the active area, or the first area B1, apart from the second contact 108', 114'. The glaze coating 116', or the area covered by the glaze coating 116', is marked by a dashed line in FIG. 1A.

Even though FIG. 1A depicts a temperature measuring sensor wherein the second contact 108', 114' is located adjacently to the second area B2, the second contact 108', 114' may also be located in another, more remote position on the top surface, e.g. adjacently to the first contact 106, 112, and the conductive connection 121 may be configured as a conductive trace, for example. Similarly, the first contact 106, 112, too, may be positioned adjacently to the contact 108', 114' and next to the second area B2.

Unlike the conventional approach according to FIG. 3, the second terminal area 120' is not located over the glaze coating 116', so that the risk of the glaze coating 116' being damaged is minimized when the lead wires are mounted by soldering or welding. At the same time, by transferring the first terminal area 126' to the bottom surface 124 one achieves, as compared to the conventional approach according to FIG. 2, that given an equally sized active area, a larger terminal area, or second area B2, is available for a mechanically stronger connection of, e.g. lead wires, or that a larger active area, or first area B1, is possible given the same mechanical strength of terminal connections.

Alternatively, other subdivisions of the top surface 102 into a first area B1 and a second area B2 are also possible, so that, for example, the second area B2 does not extend across an entire width B of the insulating substrate, but extends only up to half a width, for example. The optimum shape of the second terminal area 120' is dependent on whether, e.g., a lead wire is to be mounted in the longitudinal direction L of the insulating substrate or in the direction of the width B, or on the mechanical strength the connection is to have while taking into account the materials of the second terminal area 120' and of the lead wire, and the respective method.

The insulating substrate 100 may be $Al_2O_3$ ceramic, for example, and the measuring film 110' may be a platinum sensor structure, for example, the terminal areas 120' and 126' consisting of gold, for example, or being implemented as thick gold films. However, it shall be noted that other suitable metallizations (e.g. platinum, silver, nickel, etc., or combinations of same, e.g. platinum and gold) or suitable alloys (e.g. AgPd) may also be used.

In FIGS. 1A and 1B, the first terminal area 126' is implemented only in an area of the bottom surface 124 which corresponds to the second area B2 of the top surface 102, or of the terminal area 120'. Alternatively, the first terminal area 126' may naturally also adopt a shape different from that of the second terminal area 120', for example it may also essentially completely cover the entire bottom surface 124, so that it is directly connected to the conductive connection 122, and so that no further conductive connection 123 may be used. In addition, the first conductive layer 126' and the second conductive layer 120' may be arranged such that they fully or partly overlap or do not at all overlap with regard to their shapes and/or their arrangements on the respective surfaces 102, 124, i.e. in the direction of the length L and/or the width B.

In the embodiments depicted in FIGS. 1A and 1B, a small hole is created in the sensor chip which on the top surface 102 comprises the contacts 106, 112 and 108', 114', said hole being created at the contact 106, 112 and through the substrate 100 for the via 122 to the rear side 124. Advantageously, this is performed in a process step for all of the sensors of a wafer. Optionally, the process may also be performed on a "blank" substrate, i.e. prior to starting with the other process steps for sensor production (e.g. metal film deposition, etc.), in that at those locations within the substrate where the contact 106, 112 of the chip is to be created later on, respective bores are introduced, for example by laser processing or punching or the like.

In a further process step, this hole for the via 122 is metallized, e.g., in that a metal paste is applied using the screen printing method, which at the same time results in the contact zone reinforcements 112, 114, and part of the area or the entire area of the bottom surface 124 is metallized so as to produce the first electrically conductive layer 126, and possibly in the same step or in a separate step, the further conductive connection 123, it also being possible to employ other coating techniques (e.g. vapor deposition, sputtering, chemical coating, or a combination of these methods) in addition to the screen printing method.

For metallization, any suitable metals or metal pastes may be employed, mention here being made, by way of example only, of Ag, Au, Pt, Ni, Cu, W, etc. as well as their alloys. In addition, layer combinations of the materials mentioned may be used. In a next step, the glaze coating 116 is applied over the active area except for the contact face 108', so as to isolate and protect the structured measuring film 110' and the first contact 106, 112. The glaze 116 may also be a glass ceramic layer, a ceramic layer or a combination of these materials.

In a further step, the entire second area B2 of the top surface 102, or at least a substantial part of same (as well as of the second contact face 108') is provided with the metallization layer, or second conductive layer, 120', this metallization layer 120' in particular also covering and electrically connecting the contact zones 108', 114', which have no vias to the substrate rear side 124. This results in a conductive layer of a larger dimension than that of the contacts, so that lead wires may be attached with increased reliability. In accordance with an embodiment of the present invention, the production of the temperature measuring sensors which was described above with reference to FIGS. 1A and 1B takes place at the wafer level, i.e. a plurality of structural elements which are advantageously identical in build and which are spaced at a certain distance from one another are located on a wafer. So as to be able to divide the processed temperature measuring sensors, as result after performing the steps in accordance with FIGS. 1A and 1B, into individual temperature measuring sensors, in one arrangement relatively small face areas are kept vacant on a wafer in the edge area of the substrate 100, said face areas having marks therein which are used for dicing the wafer into individual structural elements. The above-described metallization 120' may advantageously be deposited again by means of a thick-film process, but it is also possible to use the other above-mentioned methods. Alternatively, for a via 122 for a connection to the rear side, or to the bottom surface 124, a connection may be established across an outer edge, in which case the hole for the via may be dispensed with (lateral, conductive layer which extends from the first contact 106, 112 to the conductive layer 126 on the bottom side across a lateral face connecting the top side 102 and the bottom side 124 of the substrate).

For further processing, the temperature measuring sensor described with reference to FIGS. 1A and 1B may be provided with a further metallization layer. For example, a first further metallization layer may be located on the first conductive layer 126', and a second further metallization layer may be located on the second conductive layer 120'. These further metallization layers are, e.g., soldering-tin layers for soldering on lead wires or thin gold layers serving as welding assistance so as to be able to connect the sensor chips to lead wires, cables or the like. Depending on the cases of application, at relatively high application temperatures the wires are welded on, and at lower application temperatures they are soldered to the connection of the lead wires to the temperature measuring sensor.

Additionally, the temperature measuring sensor and the lead wires may be provided with a sheathing in the area of their attachment to same. For cases of application at relatively high application temperatures, a glaze or a suitable ceramic material is used as the sheathing, which results in mechanical strengthening and offers additional chemical protection. For low application temperatures, a sheathing which may be provided may consist of a polymer material, e.g. epoxy resin. In addition, combinations of layers of the materials mentioned may be used for the sheathing.

The above-described temperature measuring sensors are advantageously manufactured at the wafer level, so that providing the structural element comprises providing a wafer having a plurality of the structural elements. The above-mentioned layers are then created at the wafer level, the temperature measuring sensors being finally diced.

Even though a description was given above of embodiments which show the contacts at opposite positions of the first area B1, it shall be noted that the present invention is not limited to this implementation, but that the contacts may be arranged at any positions within the first area B1 on the first surface 102, e.g. even adjacently to one another.

Even though a description was given above of embodiments wherein the first area B1 and the second area B2 completely or essentially completely comprise the top surface, the substrate or the top surface 102 of the insulating substrate may also be larger than the two areas B1, B2 previously mentioned.

Even though embodiments were described with regard to the manufacturing process, it shall be noted that the present invention is not limited to the indicated order of the steps in the embodiments indicated. Depending on the technical conditions, the respective steps may also be performed in an order which differs from that described. In particular, the second conductive layer may be formed prior to the first conductive layer. In addition, the conductive connection between the first contact and the bottom surface may also be established prior to or after creating the conductive layer.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A method of producing a temperature measuring sensor, comprising:
    providing the temperature measuring sensor, which comprises an insulating substrate comprising a top surface and a bottom surface, the top surface comprising a first area and a second area, and a first contact and a second contact being formed in the first area, said contacts comprising a structured measuring film formed therebetween on the top surface;
    creating a conductive connection between the first contact on the top surface of the insulating substrate and the bottom surface of the insulating substrate;
    creating a first conductive layer as a first terminal area of the temperature measuring sensor on the bottom surface such that the first conductive layer is electrically connected to the conductive connection; and
    creating a second conductive layer on the second area of the top surface as a second terminal area of the temperature measuring sensor such that the second conductive layer is in contact with the second contact.

2. The method as claimed in claim 1, wherein the second conductive layer is located exclusively on the second area of the top surface and is connected to the second contact via a conductive connection on the top surface.

3. The method as claimed in claim 1, wherein the second contact is located adjacently to the second area.

4. The method as claimed in claim 1, wherein providing comprises creating a via, within the temperature measuring sensor, which extends from the first contact through the temperature measuring sensor to the bottom surface of same.

5. The method as claimed in claim 1, wherein providing comprises creating a glaze coating on the first area of the top surface, the glaze coating being located over the first contact and the structured measuring film.

6. The method as claimed in claim 1, wherein the first conductive layer and the second conductive layer fully or partly overlap with regard to their arrangements on the respective surfaces.

7. The method as claimed in claim 1, wherein creating a first conductive layer comprises creating a conductive layer which is arranged only in an area of the bottom surface which is opposite the second area of the top surface.

8. The method as claimed in claim 1, wherein the first conductive layer and the second conductive layer do not overlap with regard to their arrangements on the respective surfaces.

9. The method as claimed in claim 1, comprising:
    connecting a first lead wire to the first terminal area, and a second lead wire to the second terminal area.

10. The method as claimed in claim 9, comprising:
    creating a sheathing which surrounds the temperature measuring sensor and the lead wires in the areas of the connection to the terminal areas.

11. The method as claimed in claim 10, wherein the lead wires are welded on or soldered on and wherein the sheathing is a glaze, a ceramic material, a polymer material or a layer combination of several of these.

12. The method as claimed in claim 1, wherein providing comprises providing a wafer comprising a plurality of the temperature measuring sensors, the method further comprising dicing the temperature measuring sensors.

13. A temperature measuring sensor comprising:

an insulating substrate comprising a top surface and a bottom surface, the top surface comprising a first area and a second area, and a first contact and a second contact being formed in the first area, said contacts comprising a structured measuring film formed therebetween on the top surface;

a conductive connection between the first contact on the top surface of the insulating substrate and the bottom surface of the insulating substrate;

a first conductive layer as a first terminal area of the temperature measuring sensor on the bottom surface, said conductive layer being implemented such that the first conductive layer is electrically connected to the conductive connection; and a second conductive layer on the second area of the top surface as a second terminal area of the temperature measuring sensor, said conductive layer being implemented such that the second conductive layer is in contact with the second contact.

* * * * *